(12) United States Patent
Autry

(10) Patent No.: US 8,237,171 B2
(45) Date of Patent: Aug. 7, 2012

(54) HIGH VOLTAGE HIGH PACKAGE PRESSURE SEMICONDUCTOR PACKAGE

(75) Inventor: Tracy Autry, Trabuco Canyon, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 155 days.

(21) Appl. No.: 12/658,576

(22) Filed: Feb. 9, 2010

(65) Prior Publication Data
US 2011/0193098 A1 Aug. 11, 2011

(51) Int. Cl.
*H01L 29/15* (2006.01)

(52) U.S. Cl. ............ 257/77; 257/682; 257/E23.135; 257/E29.104

(58) Field of Classification Search ............ 257/77, 257/682, E23.135, E29.104, E23.18; 438/619
See application file for complete search history.

(56) References Cited

U.S. PATENT DOCUMENTS

| | | | |
|---|---|---|---|
| 5,213,877 A * | 5/1993 | Yoshida et al. | 428/209 |
| 5,219,794 A * | 6/1993 | Satoh et al. | 228/121 |
| 5,315,155 A * | 5/1994 | O'Donnelly et al. | 257/711 |
| 5,467,913 A * | 11/1995 | Namekawa et al. | 228/41 |
| 5,469,618 A * | 11/1995 | LeMonds et al. | 29/889.72 |
| 5,595,939 A * | 1/1997 | Otake et al. | 438/51 |
| 5,616,520 A * | 4/1997 | Nishiuma et al. | 438/125 |
| 5,624,523 A * | 4/1997 | Stiller | 156/285 |
| 5,637,922 A * | 6/1997 | Fillion et al. | 257/728 |
| 5,801,073 A * | 9/1998 | Robbins et al. | 438/125 |
| 5,897,338 A * | 4/1999 | Kaldenberg | 438/116 |
| 6,371,488 B1 * | 4/2002 | Szymborski et al. | 277/365 |
| 6,450,039 B1 * | 9/2002 | Masuda | 73/756 |
| 6,521,478 B2 * | 2/2003 | Chen | 438/106 |
| 6,720,647 B2 * | 4/2004 | Fukuizumi | 257/704 |
| 7,166,914 B2 * | 1/2007 | DiStefano et al. | 257/713 |
| 7,462,919 B2 * | 12/2008 | Engling et al. | 257/419 |
| 7,670,688 B2 * | 3/2010 | Kaushal et al. | 428/469 |
| 2001/0020736 A1 * | 9/2001 | Nakazawa et al. | 257/678 |
| 2002/0088991 A1 * | 7/2002 | Hisamoto | 257/172 |
| 2003/0185948 A1 * | 10/2003 | Garwood | 426/392 |
| 2003/0205091 A1 * | 11/2003 | Bodin | 73/753 |
| 2004/0075160 A1 * | 4/2004 | Eng et al. | 257/623 |
| 2005/0078456 A1 * | 4/2005 | Mandel et al. | 361/719 |
| 2005/0127068 A1 * | 6/2005 | Tang et al. | 219/700 |
| 2006/0043555 A1 * | 3/2006 | Liu | 257/680 |
| 2007/0040186 A1 * | 2/2007 | Fillion et al. | 257/177 |
| 2007/0080362 A1 * | 4/2007 | Scotch et al. | 257/99 |
| 2007/0264105 A1 * | 11/2007 | Pharand et al. | 414/217 |
| 2008/0164588 A1 * | 7/2008 | Lee et al. | 257/668 |
| 2008/0282802 A1 * | 11/2008 | Pike et al. | 73/514.32 |
| 2008/0305355 A1 * | 12/2008 | Zimmerman et al. | 428/626 |
| 2009/0096041 A1 * | 4/2009 | Sakakibara et al. | 257/419 |
| 2010/0013106 A1 * | 1/2010 | Otremba et al. | 257/777 |
| 2010/0044811 A1 * | 2/2010 | Hooper et al. | 257/415 |
| 2010/0193574 A1 * | 8/2010 | Cretegny et al. | 228/234.1 |

* cited by examiner

*Primary Examiner* — N Drew Richards
*Assistant Examiner* — Ankush Singal
(74) *Attorney, Agent, or Firm* — Marger Johnson & McCollom PC

(57) ABSTRACT

A hermetically sealed integrated circuit package that includes a cavity housing a semiconductor die, whereby the cavity is pressurized during assembly and when formed. The invention prevents the stress on a package created when the package is subject to high temperatures at atmospheric pressure and then cooled from reducing the performance of the die at high voltages. By packaging a die at a high pressure, such as up to 50 PSIG, in an atmosphere with an inert gas, and providing a large pressure in the completed package, the dies are significantly less likely to arc at higher voltages, allowing the realization of single die packages operable up to at least 1200 volts. Moreover, the present invention is configured to employ brazed elements compatible with Silicon Carbide dies which can be processed at higher temperatures.

19 Claims, 2 Drawing Sheets

HIGH VOLTAGE HIGH PACKAGE PRESSURE SEMICONDUCTOR PACKAGE

CROSS REFERENCE TO RELATED APPLICATIONS

Cross-reference is made to the commonly assigned co-pending patent application entitled, "Silicon Carbide Semiconductor," filed on Feb. 9, 2010, and assigned U.S. patent application Ser. No. 12/658,328, the entirety of which is incorporated by reference.

FIELD OF THE INVENTION

This invention relates generally to packaging technology for high voltage semiconductor dies, and more particularly to those operating at voltages well in excess of 500 Volts and subject to arcing, such as a rectifier diode.

BACKGROUND OF THE INVENTION

There are numerous technologies available for packaging semiconductor dies. Packages are typically chosen based on criteria such as reliability, such as Mil-Spec devices utilizing hermetically sealed packages, operating power and temperatures such as power supply and converter circuits, and cost such as basic plastic or ceramic packages for commercial applications.

Schottky devices are used extensively in power supply and converter outputs for military and space systems. These high reliability applications require the use of a hermetically sealed package to prevent moisture from contacting the die and degrading electrical performance. There is a great need for hermetic Schottky devices in small surface mount packages to reduce the size and weight of the circuit.

High power devices, such as transient voltage suppressors (TVSs), are configured to prevent damage to protected circuits by high voltage spikes. These TVSs are designed to operate at voltages up to about 500 volts for single die packages, and multi-stacked dies may be employed for higher voltages, although these devices are much more complex and expensive. One of the basic limitations of single high voltage die TVSs is that the dies will arc and become inoperative if they are subjected to excessive voltages.

High voltage rectifiers above 500 V are very common in the micro-electronic industry. Electrical arcing internally to the micro-electronic package, either across the die itself or from package electrode-to-electrode, is always a concern. A common solution is to add a dielectric polymer coating over the high voltage die to prevent arcing. For high reliability devices, such as Mil-Spec devices, hermetic packages containing polymer dielectric coatings are problematic due to the polymer's temperature limitations and high thermal expansion causing potential reliability issues after temperature cycling.

There is desired a semiconductor device and package that is operable well over 500 volts and that is not prone to arcing, including devices that are operable over 1000 volts. Such a device and package should be suitable for a single die device.

SUMMARY OF INVENTION

The present invention achieves technical advantages as a hermetically sealed integrated circuit package that includes a cavity housing and semiconductor die, whereby the cavity is pressurized during assembly when hermetically sealing. The present invention prevents low pressure atmosphere in a sealed package created when the package is subject to high temperatures at atmospheric pressure during hermetic sealing, such as in belt furnaces and then cooled. By packaging the dies at larger pressures, such as up to 50 PSIG, in chambers with an inert gas, and providing a large pressure in the completed package, the dies are significantly less likely to arc, allowing the creation of single die packages operable up to at least 1200 volts. Moreover, the present invention is configured to employ brazed elements compatible with Silicon Carbide dies which can be processed at higher temperatures.

BRIEF DESCRIPTION OF THE DRAWINGS

The above-stated objects and advantages are achieved in accordance with the specifications and drawings which follow.

DETAILED DESCRIPTION OF THE PRESENT INVENTION

Figure 1:
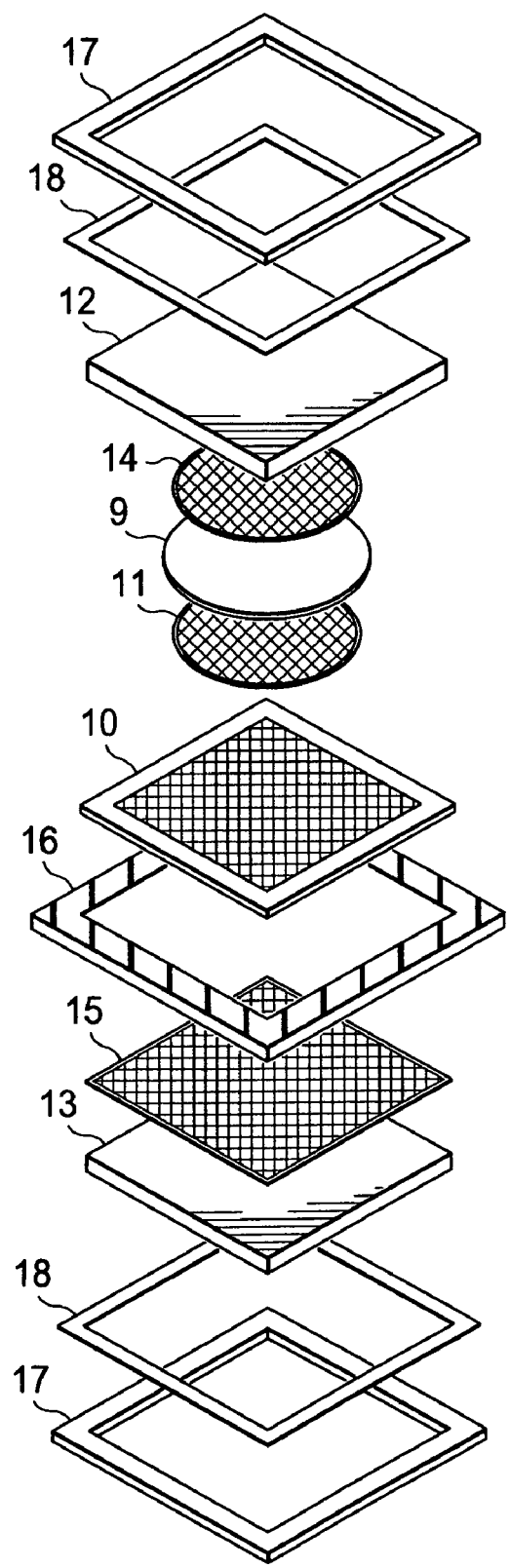
FIG. 1 is an exploded view of one embodiment of the invention, a packaging technology configured to be processed at high pressure and high temperature, including Silicon Carbide dies.

As shown in FIG. 1, the device according to one aspect of the invention includes a hermetic surface mount technology containing a single die, such as a Schottky die with metallization (contact area) on both sides, processed at high pressures well about atmospheric pressure (0 PSIG) in an inert gas, such as nitrogen, or helium. The die can be a conventional silicon die, or a more advanced Silicon Carbide die. This package design is superior to the existing art, particularly since the packaged device is operable at significantly higher voltages without arcing between the upper pad and the die, up to at least 1200 V, such as a rectifier, a significant improvement over conventional single die devices operable up to about 500 V. Two terminal dies, such as diodes, as well as multi-terminal dies, such as a JFET, can be packages as well and limitation to a 2 terminal die is not to be inferred.

Moreover, in another aspect of the invention, brazed pads are metallurgically bonded to each side of the die, such as a Silicon Carbide die, such that a high temperature brazing bond to both sides of the die are achieved, instead of low temperature bonding achievable using conventional solder at a lower temperature. The technology differs from prior designs, in that a die can be processed at temperatures of about 700 C to achieve a direct bond, and eliminates any wires, straps, springs, or clips to connect to the die. The package allows for visual inspection of the brazed contact to the die on both sides, prior to sealing the package in a separate step.

In one preferred embodiment, the tungsten disc 9 (which can also be molybdenum) is essentially a flat plate, shaped to provide uniform thickness throughout, such that each major surface consists of a single plane. Pure tungsten is preferred due to its CTE (4.5 ppm/C, or molybdenum which is 4.9 ppm/C) which is closely matched to silicon (4 ppm/C) or Silicon Carbide. Composite metals may be used, but are not preferable due to high cost and higher CTE. Tungsten has adequate thermal conductivity (Tc=170 W/m-K) and low electrical resistance (5.6 micro ohms-cm), especially when the thickness is limited to about 0.005".

The tungsten disc 9 is plated with about 50 micro inches of nickel, and then over-plated with about 100 micro inches of gold (or silver). In one preferred embodiment, the tungsten disc 9 is brazed to the top side of the Silicon Carbide Schottky die 10 with a braze preform 11, such as comprised of an alloy comprising 80% copper, 15% silver and 5% phosphorus (or equivalent) at over 700 degree C. In another preferred embodiment, the disc 9 can be soldered to the top side of a silicon die 10 using a gold/tin solder perform (or lead/tin/silver, or equivalent) at over 350 degrees C. The alignment of the disc is maintained using a fixture such as a graphite boat.

Advantageously, the brazing or soldering is performed in a DAP sealer at a significantly elevated pressure, in excess of atmospheric pressure (0 PSIG), such as at 10 PSIG, and up to 50 PSIG, with a nitrogen, hydrogen, helium or other inert/noble gas atmosphere (hydrogen/nitrogen mixture). One advantage of this process is the discovery that processing dies at high temperature and at atmospheric pressure degrades the die performance at higher voltages, due in part to the fact that the pressure in the hermetic package cavity is less than 0 PSIG when cooled given the direct relationship of pressure and temperature. The present invention processes the package, and realizes a package cavity pressure 20, as a function of the desired operating voltage of the die. Higher pressures allow higher operating voltages. A single die, high voltage device is achievable according to one aspect of the present invention.

In one embodiment, the invention provides a Schottky die 10 that may be of silicon or Silicon Carbide, which has solderable or brazable metallization, respectively, such as silver or gold (not aluminum, which is designed for aluminum wire wedge bond). The tungsten disc 9 acts as a spacer to prevent the top molybdenum pad 12 (installed later) from arcing to the edge of the Schottky die 10 during operation at high voltages and destroying the die. No spacer is required on the opposite side of the die, since the die geometry does not present a risk of arcing on both sides. Visual inspection can be performed at this step to guarantee an acceptable solder or brazed bond, respectively, between the tungsten disc 9 and the Schottky die 10.

This embodiment of the invention utilizes a top 12 and bottom 13 molybdenum (or tungsten) pad that provides the electrical and thermal connection to the outside of the device. Pure molybdenum is preferred due to its light weight and CTE (4.9 ppm/degree C.) which is closely matched to silicon and tungsten. Again, composite metals are not desirable due to high cost and higher CTE, but are suitable. Molybdenum has adequate thermal conductivity (Tc=140 W/m-K) and low electrical resistance (5.7 micro ohms-cm), especially when the thickness is limited to about 0.030".

The molybdenum pads 12 and 13 are plated with about 50 micro inches of nickel which is sintered (baked at over 800 C in hydrogen to drive the plating into the molybdenum), then over-plated with about 100 micro inches of gold (or silver) and sintered (optional). Simultaneously, the top molybdenum pad 12 is soldered or brazed in a high pressure atmosphere as previously described, such as 10-50 PSIG, at a temperature depending on whether the preforms are solderable or brazable as previously described regarding silicon and Silicon Carbide dies, to the tungsten disc 9, and the bottom molybdenum pad 13 is soldered or brazed, respectively, to the bottom of the Schottky die 10 with solder or braze preforms 14 and 15. The temperature is preferably at 350 C for soldered contacts, and 700 C for brazed contacts. Alignment is again maintained using a fixture such as a graphite boat and soldering is performed in a DAP sealer or belt furnace with a nitrogen, hydrogen or forming gas atmosphere at substantially elevated pressure as previously described. This construction advantageously provides a pressurized cavity 20 allowing significantly higher operating voltages, allows direct and maximum contact to the Schottky die 10, and visual inspection prior to sealing (precap inspection). Visual inspection can be performed at this step to guarantee acceptable solder or brazed bond between the tungsten disc 9 and the top molybdenum pad 12 and between the bottom molybdenum pad 13 and the Schottky die 10.

The ceramic frame 16 is a single-piece structure, made of alumina or mullite ($3Al_2O_3-2SiO_2$). The use of a single-piece frame increases the strength, reliability, and hermeticity of the package. The mullite or alumina is pressed or molded by tooling, then fired at about 1400 C-1500 C. The ceramic frame 16 is selectively metalized, such as with moly manganese, alumina (or equivalent). Either simultaneously or as a sequential operation, metallization is applied to both sides of the ceramic frame 16. The metallization is generally applied by a screen printing operation which provides an accurate deposition of a controlled thickness. The ceramic frame 16 is then fired at about 1300 C-1400 C to bind the metallization to the ceramic frame. The metallization is plated with about 50 to 150 micro inches of nickel. To improve adhesion of the nickel, the frame may be sintered at about 600 C.

The metal seal rings 17 are made of Alloy 42 which has a CTE of 4.3 ppm/C. (any other metal may be used which has a close CTE to the ceramic frame 16). Alloy 42 is chosen due to its very low cost, ease of machining or stamping, and close CTE match to mullite, molybdenum, tungsten, and silicon. The ceramic frame 16 and the two seal rings 17 are soldered or brazed simultaneously to the molybdenum pads 12 and 13 with extra thick square ring shaped preforms 18 (of similar material to performs 11 and 14) at over 300 C or 700 C, depending on whether the perform is solderable or brazable with the silicon or Silicon Carbide die, respectively, as previously described. Alignment is maintained using a fixture such as a graphite boat and soldering or brazing is performed in a DAP sealer with a nitrogen, hydrogen or forming gas atmosphere. The temperature and profile are chosen such that forming the solder seal will not reflow the die attach, or the brazed seal will have high integrity.

The unique construction of these embodiments of the invention provides for an increase in hermetic seal area, since the preform 18 can bond simultaneously to three surfaces: the seal rings 17, the sides of the molybdenum pads 12 and 13, and the metallization on the ceramic frame 16. This provides superior hermetic seal and improved mechanical strength. The periphery of the hermetic seal may be visually inspected for solder fillet if provided or integrity of the brazed seal, and the device can be tested for fine and gross leak test to verify the hermetic seal. Silicon or Silicon Carbide Schottky die must be sealed in a controlled atmosphere to prevent moisture from contaminating the junction. Solder seal and brazed seal can be performed in a DAP sealer or belt furnace for high volume, low cost manufacturing, while maintaining a controlled atmosphere at a substantially elevated atmospheric pressure.

Figure 2:
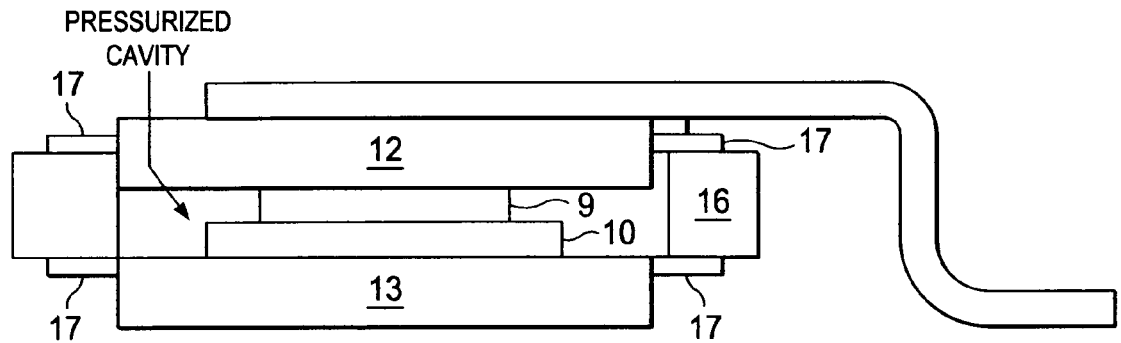
FIG. 2 illustrates a sequence of assembling the package using brazed or soldered discs.

FIG. 2 depicts a cross section of the assembled package, depicting the pressured cavity 20 about the hermetically sealed die 10. As previously described, the packaging of the die at a high pressure, and then maintaining the high pressure in the package after cooling the package advantageously allows for die to be operated significantly higher operative voltages. Advantageously, by way of just one example, a single die TVS is realized with operating voltages of at least 1200 V, which is highly desirable in the more advanced products needing improved electrostatic discharge (ESD) protection.

Figure 3:
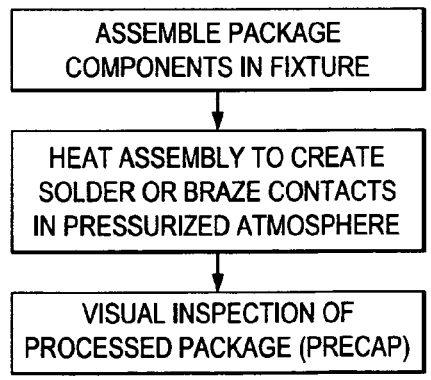
FIG. 3 illustrates a process for packaging a die according to one methodology of the present invention.

FIG. 3 depicts a process for packaging the die, comprising the steps of:
arranging the package components in a fixture, such as a boat;
assembling the package at a high atmospheric pressure such as 10 PSIG and up to 50 PSIG or higher, such as using a DAP sealer, to simultaneously achieve the soldered or brazed contacts; and
visually inspecting the assembled package (precap inspection).

It is apparent that there has been provided in accordance with this invention an improved technology for packaging a die, fully satisfying the objects, means and advantages set forth above. While the invention has been described in combination with specific embodiments and examples thereof, many alternatives, modifications and variations will be apparent to those skilled in the art, after reading the foregoing description. For example, although a silicon or Silicon Carbide Schottky device is illustrated in detail, the invention also applies to any other die with solderable and brazable contacts. Accordingly, it is intended to embrace all such alternatives, modifications and variations within the spirit and scope of the appended claims.

Though the invention has been described with respect to a specific preferred embodiment, many variations and modifications will become apparent to those skilled in the art upon reading the present application. The intention is therefore that the appended claims be interpreted as broadly as possible in view of the prior art to include all such variations and modifications.

What is claimed is:

1. A packaged microelectronic high power device for reducing arcing between a package and a die, comprising:
the die including a high power device, wherein the die has a top major surface and a bottom major surface;
a package including a cavity defined by a first pad and a second pad and having the die disposed therebewteen, wherein the bottom major surface of the die is coupled to the second pad; and
a spacer coupled between the first pad and the top major surface of the die;
wherein the cavity is filled with an inert gas and pressurized above 0 PSIG.

2. The packaged microelectronic device as specified in claim 1 wherein the cavity is hermetically sealed.

3. The packaged microelectronic device as specified in claim 1 wherein the die is silicon.

4. The packaged microelectronic device as specified in claim 1 wherein the die is Silicon Carbide, further comprising at least one braze material coupled to the die.

5. The packaged microelectronic device as specified in claim 1, wherein a first braze material is brazed to the top major surface and a second braze material is brazed to the bottom major surface.

6. The packaged microelectronic device as specified in claim 1 wherein the die is configured to operate at a voltage of at least 500 V.

7. The packaged microelectronic device as specified in claim 1, wherein the die is comprised of a transient voltage suppressor.

8. The packaged microelectronic device as specified in claim 2 wherein the cavity is pressurized at 10 PSIG or above.

9. The packaged microelectronic device as specified in claim 2, wherein the cavity is pressurized at 50 PSIG.

10. The packaged microelectronic device as specified in claim 6 wherein the die is configured to operate at a voltage of at least 800 V.

11. The packaged microelectronic device as specified in claim 6 wherein the die is configured to operate at a voltage of at least 1200 V.

12. The packaged microelectronic device as specified in claim 6, wherein a first braze material is brazed to the top major surface and a second braze material is brazed to the bottom major surface.

13. A packaged microelectronic high power device for reducing arcing between a package and a die, comprising:
the die including a high power device, wherein the die has a top major surface and a bottom major surface;
a package including a cavity defined by a first pad that includes molybdenum and a second pad that includes molybdenum and having the die disposed therebetween, wherein the bottom major surface of the die is coupled to the second pad; and
a spacer that includes tungsten coupled to the first pad and the top major surface of the die;
wherein the cavity is hermetically sealed, filled with an inert gas, and pressurized within a range between 10 and 50 PSIG.

14. The packaged microelectronic high power device of claim 13, wherein the die is silicon.

15. The packaged microelectronic high power device of claim 13, wherein the die is silicon carbide, further comprising at least one braze material coupled to the die.

16. The packaged microelectronic high power device of claim 13, wherein a first braze material is brazed to the top major surface and a second braze material is brazed to the bottom major surface.

17. The packaged microelectronic high power device of claim 13, wherein the die is configured to operate at a voltage of at least 500 V.

18. The packaged microelectronic high power device of claim 13, wherein the die is configured to operate at a voltage of at least 800 V.

19. The packaged microelectronic high power device of claim 13, wherein the die is configured to operate at a voltage of at least 1200 V.

* * * * *